(12) United States Patent
Guo (10) Patent No.: US 9,099,188 B2
(45) Date of Patent: Aug. 4, 2015

(54) MAGNETORESISTIVE ELEMENT

(71) Applicant: Yimin Guo, San Jose, CA (US)

(72) Inventor: Yimin Guo, San Jose, CA (US)

( * ) Notice: Subject to any disclaimer, the term of this patent is extended or adjusted under 35 U.S.C. 154(b) by 1 day.

(21) Appl. No.: 14/200,003

(22) Filed: Mar. 6, 2014

(65) Prior Publication Data

US 2014/0254252 A1    Sep. 11, 2014

Related U.S. Application Data

(60) Provisional application No. 61/775,580, filed on Mar. 9, 2013.

(51) Int. Cl.
| | | |
|---|---|---|
| *G11C 11/00* | (2006.01) | |
| *G11C 11/16* | (2006.01) | |
| *H01L 27/22* | (2006.01) | |
| *H01L 43/08* | (2006.01) | |
| *H01F 10/32* | (2006.01) | |

(52) U.S. Cl.
CPC ........ *G11C 11/1673* (2013.01); *H01F 10/3263* (2013.01); *H01F 10/3286* (2013.01); *H01L 27/228* (2013.01); *H01L 43/08* (2013.01); *H01F 10/329* (2013.01); *H01F 10/3272* (2013.01)

(58) Field of Classification Search
CPC ....................................................... G11C 11/00
USPC ......... 365/48, 55, 62, 66, 74, 78, 80–93, 100, 365/130, 131, 148, 158, 171–173, 209, 213, 365/225.5, 230.07, 232, 243.5; 257/295, 257/421, 422, 427, E21.665, E27.006; 438/3; 977/933–935
See application file for complete search history.

(56) References Cited

U.S. PATENT DOCUMENTS

| | | | |
|---|---|---|---|
| 2007/0025029 A1* | 2/2007 | Hayakawa et al. | 360/324.2 |
| 2010/0034014 A1* | 2/2010 | Ohno et al. | 365/158 |
| 2012/0147663 A1* | 6/2012 | Ney | 365/158 |

* cited by examiner

*Primary Examiner* — Harry W Byrne (57) ABSTRACT

A STT-MRAM comprises apparatus, and method of operating a double-MTJ magnetoresistive memory and a plurality of magnetoresistive memory element having a first recording layer which has an interface interaction with an underneath dielectric functional layer and having a second recording layer which has no interface interaction with an underneath dielectric functional layer. The energy switch barrier of the first recording layer is reduced under an electric field applying along a perpendicular direction of the functional with a proper voltage on a digital line from a control circuitry; accordingly, the magnetization of the first recording layer is readily reversible in a low spin-transfer switching current while the magnetization of the second recording layer is readily reversible in a high spin-transfer switching current, enabling two separate bits recording in a double MTJ stack.

41 Claims, 3 Drawing Sheets

MAGNETORESISTIVE ELEMENT

RELATED APPLICATIONS

This application claims the priority benefit of U.S. Provisional Application No. 61/775,580 filed on Mar. 9, 2013, which is incorporated herein by reference.

BACKGROUND OF THE INVENTION

1. Field of the Invention

This invention relates generally to a spin-transfer-torque multi-bit magnetic-random-access memory (MRAM) element, more particularly to structures and methods of reading and programming a spin-torque magnetoresistive random access memory (MRAM) element having an electric field assisted recording.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can also cope with high-speed reading and writing. A ferromagnetic tunnel junction has a three-layer stack structure formed by stacking a recording layer having a changeable magnetization direction, an insulating tunnel barrier layer, and a fixed layer that is located on the opposite side from the recording layer and maintains a predetermined magnetization direction. Corresponding to the parallel and anti-parallel magnetic states between the recording layer magnetization and the reference layer magnetization, the magnetic memory element has low and high electrical resistance states, respectively. Accordingly, a detection of the resistance allows a magnetoresistive element to provide information stored in the magnetic memory device.

There has been a known technique for achieving a high MR ratio by forming a crystallization acceleration film that accelerates crystallization and is in contact with an interfacial magnetic film having an amorphous structure. As the crystallization acceleration film is formed, crystallization is accelerated from the tunnel barrier layer side, and the interfaces with the tunnel barrier layer and the interfacial magnetic film are matched to each other. By using this technique, a high MR ratio can be achieved.

Typically, MRAM devices are classified by different write methods. A traditional MRAM is a magnetic field-switched MRAM utilizing electric line currents to generate magnetic fields and switch the magnetization direction of the recording layer in a magnetoresistive element at their cross-point location during the programming write. A spin-transfer torque (or STT)-MRAM has a different write method utilizing electrons' spin momentum transfer. Specifically, the angular momentum of the spin-polarized electrons is transmitted to the electrons in the magnetic material serving as the magnetic recording layer. According to this method, the magnetization direction of a recording layer is reversed by applying a spin-polarized current to the magnetoresistive element. As the volume of the magnetic layer forming the recording layer is smaller, the injected spin-polarized current to write or switch can be also smaller. In a so-called perpendicular STT-MRAM, both two magnetization films in an MTJ stack have easy axis of magnetization in a direction perpendicular to the film plane due to their strong magnetic crystalline anisotropy and interface interaction induced anisotropy, shape anisotropies are not used, and accordingly, the device shape can be made smaller than that of an in-plane magnetization type. Also, variance in the easy axis of magnetization can be made smaller. Accordingly, both miniaturization and lower currents can be expected to be achieved while a thermal disturbance resistance is maintained. In another word, perpendicular STT-MRAM having high speed, large capacities and low-power-consumption operations can potentially replace the conventional semiconductor memory used in electronic chips, especially mobile chips for power saving and non-volatility.

Reading STT MRAM involves applying a voltage to the MTJ stack to discover whether the MTJ element states at high resistance or low. Theoretically, an MRAM comprising double MTJ stacks having two MTJ junctions in series may have four different resistances, providing an opportunity to have double data storage capability than a traditional MRAM having a single magnetic tunnel junction. However, to correctly recording data in each MTJ junction requires significant difference in critical spin transfer voltages between both two MTJ junctions without reliability issues. Working margins between junction break-down voltage, recording voltages and reading voltage are expected to very small.

Thus, it is desirable to provide a novel STT-MRAM structures and methods that realize highly-accurate reading, highly-reliable recording of multi-bits and low power consumption while suppressing destruction and reduction of life of MTJ memory device due to recording in a nonvolatile memory that performs recording resistance changes, and maintaining a high thermal factor for a good data retention.

BRIEF SUMMARY OF THE PRESENT INVENTION

The present invention comprises a magnetoresistive element having an electric field assisted spin transfer torque magnetization switching of a first recording layer in a first MTJ junction and a spin transfer torque magnetization switching of a second recording layer in a second MTJ junction for a high capacity and low power spin-transfer-torque MRAM with a large operating margin. The magnetoresistive element in the invention has two MTJ junctions stacked together and three terminals: an upper electrode connected to a bit line, a middle electrode connected to a select transistor and a digital line as a bottom electrode wherein a double MTJ stack comprises a dielectric functional layer provided on top surface of the digital line, a first recording layer on top surface of the dielectric functional layer, a first tunnel barrier layer on top surface of the first recording layer, a reference layer on top surface of the first tunnel barrier layer, a second tunnel barrier layer on top surface of the reference layer, a second recording layer on top surface of the second tunnel barrier layer and a cap layer on top surface of the second recording layer. It further also comprises a write circuit which supplies a voltage drop or electric field on a functional layer and bi-directionally supplies a spin polarized current to the double-MTJ stack.

As a first embodiment, an exemplary embodiment includes structure and method of operating a perpendicular spin-transfer-torque magnetoresistive memory including a circuitry coupled to the bit line positioned adjacent to selected ones of the plurality of magnetoresistive memory elements to supply a reading current or bi-directional spin-transfer recording current, and coupled to the digital line configured to generate an electric field pointing up away from the top surface of the functional layer and accordingly to decrease the perpendicular anisotropy strength of the first recording layer. Thus magnetization of a first recording layer can be readily switched or reversed to the direction in accordance with a direction of a second current across the MTJ stack by applying a second spin transfer current having a much lower value, after the second recording layer magnetization is first switched to the direction in accordance with a direction of a first current across the MTJ stack by applying a first spin transfer current.

As a second embodiment, an exemplary embodiment includes structure and method of operating a planar spin-transfer-torque magnetoresistive memory including a circuitry coupled to the bit line positioned adjacent to selected ones of the plurality of magnetoresistive memory elements to supply a reading current or bi-directional spin-transfer recording current, and coupled to the digital line configured to generate an electric field pointing down to the top surface of the functional layer and accordingly to introduce or enhance the perpendicular anisotropy strength of the first recording layer. Thus magnetization of a first recording layer can be readily switched or reversed to the direction in accordance with a direction of a second current across the MTJ stack by applying a second spin transfer current having a much lower value, after the second recording layer magnetization is first switched to the direction in accordance with a direction of a first current across the MTJ stack by applying a first spin transfer current.

Various embodiments will be described hereinafter with reference to the companying drawings. The drawings are schematic or conceptual, and the relationships between the thickness and width of portions, the proportional coefficients of sizes among portions, etc., are not necessarily the same as the actual values thereof.

DETAILED DESCRIPTION OF THE INVENTION

In general, according to a first embodiment, there is provided a perpendicular magnetoresistive memory cell comprising:
a digital line provided on a surface of a substrate serving as a bottom electrode;
a dielectric functional layer provided on the top surface of the digital line layer;
a first recording layer provided on the top surface of the dielectric functional layer having magnetic anisotropy in a direction perpendicular to a film surface and having a variable magnetization direction;
a first tunnel barrier layer provided on the top surface of the first recording layer;
a reference layer provided on the top surface of the first tunnel barrier layer having magnetic anisotropy in a direction perpendicular to a film surface and having an invariable magnetization direction;
a second tunnel barrier layer provided on the top surface of the reference layer;
a second recording layer provided on the top surface of the second tunnel barrier layer having magnetic anisotropy in a direction perpendicular to a film surface and having a variable magnetization direction;
a cap layer provided on the top surface of the second recording layer as an upper electric electrode;
a middle electrode provided on sides of the first recording layer and electrically connected to the first recording layer;
a bit line provided on the top surface of the cap layer;
a CMOS transistor coupled the plurality of magnetoresistive memory elements through the middle electrode.

There is further provided circuitry connected to the bit line, the digital line and the select transistor of each magnetoresistive memory cell.

In general, according to a second embodiment, there is provided a planar magnetoresistive memory cell comprising:
a digital line provided on a surface of a substrate serving as a bottom electrode;
a dielectric functional layer provided on the top surface of the digital line layer;
a first recording layer provided on the top surface of the dielectric functional layer having an uniaxial magnetic anisotropy in a film surface and having a variable magnetization direction;
a first tunnel barrier layer provided on the top surface of the first recording layer;
a reference layer provided on the top surface of the first tunnel barrier layer having magnetic anisotropy and having an invariable magnetization direction in a film surface;
a second tunnel barrier layer provided on the top surface of the reference layer;
a second recording layer provided on the top surface of the second tunnel barrier layer having an uniaxial magnetic anisotropy in a film surface and having a variable magnetization direction;
a cap layer provided on the top surface of the second recording layer as an upper electric electrode;
a middle electrode provided on sides of the first recording layer and electrically connected to the first recording layer;
a bit line provided on the top surface of the cap layer;
a CMOS transistor coupled the plurality of magnetoresistive memory elements through the middle electrode.

There is further provided circuitry connected to the bit line, the digital line and the select transistor of each magnetoresistive memory cell.

A dielectric functional layer is made of a metal oxide (or nitride, chloride) layer having a naturally stable rocksalt crystal structure having the (100) plane parallel to the substrate plane and with lattice parameter along its {110} direction being larger than the bcc (body-centered cubic)-phase Co lattice parameter along {100} direction. As an amorphous ferromagnetic material, like CoFeB, in the recording layer is thermally annealed, a crystallization process occurs to form bcc CoFe grains having epitaxial growth with (100) plane parallel to surface of the rocksalt crystal functional layer.

In a rocksalt crystal structure of a functional layer, such as MgO, two fcc sublattices for metal atoms and O atoms, each displaced with respect to the other by half lattice parameter along the [100] direction. However, at a surface, 0 atoms protrude while metal atoms retreat slightly from the surface, forming a strong interface interaction with the bcc CoFe grains. Accordingly, a perpendicular anisotropy and a perpendicular magnetization are induced in the first recording layer, as a result of the strong interface interaction between the first recording layer and the functional layer.

Further, as an electric field is applied on the functional layer and perpendicular to the surface, the negative charged O atoms and positive charged metal atoms at surface are pulled toward opposite directions and modify the interface interaction between the bcc CoFe grains in the soft adjacent layer and the rocksalt crystal grains in the functional layer. When an electric field points down towards the top surface of a functional layer, O atoms protrude more from the surface and form a stronger interface interaction with the bcc CoFe grains, causing an enhanced perpendicular anisotropy, and vice versa. This mechanism is utilized hereafter to manipulate the perpendicular anisotropy strength and magnetization direction of the recording layer through applying an electric field on the dielectric functional layer.

In a first embodiment, an exemplary embodiment includes structure and method of operating a perpendicular spin-transfer-torque magnetoresistive memory including a circuitry coupled to the bit line positioned adjacent to selected ones of the plurality of magnetoresistive memory elements to supply a reading current or bi-directional spin-transfer recording current, and coupled to the digital line configured to generate an electric field pointing up away from the top surface of the functional layer and accordingly to decrease the perpendicular anisotropy strength of the first recording layer. Thus magnetization of a first recording layer can be readily switched or reversed to the direction in accordance with a direction of a second current across the MTJ stack by applying a second spin transfer current having a much lower value, after the second recording layer magnetization is first switched to the direction in accordance with a direction of a first current across the MTJ stack by applying a first spin transfer current.

In the second embodiment, an exemplary embodiment includes structure and method of operating a planar spin-transfer-torque magnetoresistive memory including a circuitry coupled to the bit line positioned adjacent to selected ones of the plurality of magnetoresistive memory elements to supply a reading current or bi-directional spin-transfer recording current, and coupled to the digital line configured to generate an electric field pointing down to the top surface of the functional layer and accordingly to introduce or enhance the perpendicular anisotropy strength of the first recording layer. Thus magnetization of a first recording layer can be readily switched or reversed to the direction in accordance with a direction of a second current across the MTJ stack by applying a second spin transfer current having a much lower value, after the second recording layer magnetization is first switched to the direction in accordance with a direction of a first current across the MTJ stack by applying a first spin transfer current.

The following detailed descriptions are merely illustrative in nature and are not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

Figure 1:
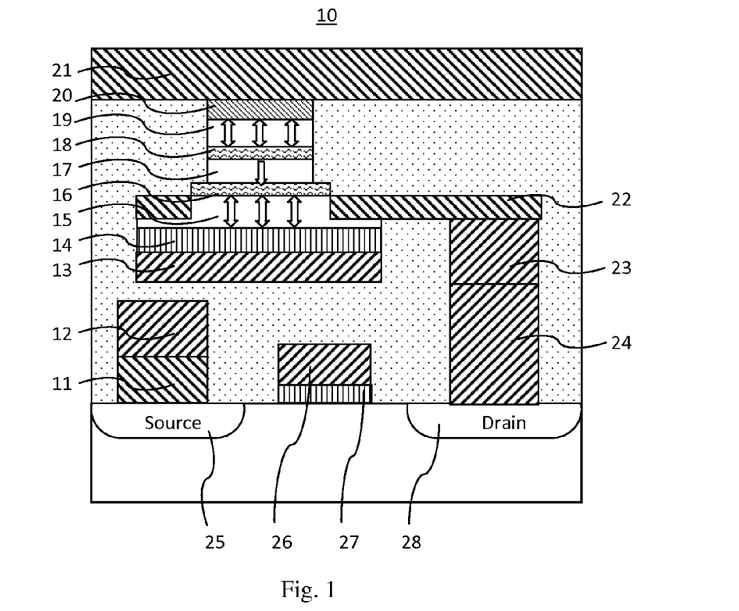
FIG. 1 is a cross-section of one memory cell in a perpendicular STT-MRAM array, according to the first embodiment, having a double MTJ stack and an electric field assisted switching.

FIG. 1 is a cross-sectional view of a double MTJ magnetoresistive memory cell 10 in a STT-MRAM array having an electric field assisted switching. The magnetoresistive memory cell 10 is configured by a digital line 13, a dielectric functional layer 14, a first recording layer 15, a first tunnel barrier 16, a reference layer 17, a second tunnel barrier 18, a second recording layer 19, a cap layer 20, a bit line 21, and a select transistor comprising an interconnect layer 12, a source contact 11, a middle electrode 22, a via 23, drain contact 24, source region 25, a gate electrode 26, a gate insulating film 27 and a drain region 28.

Figure 2:
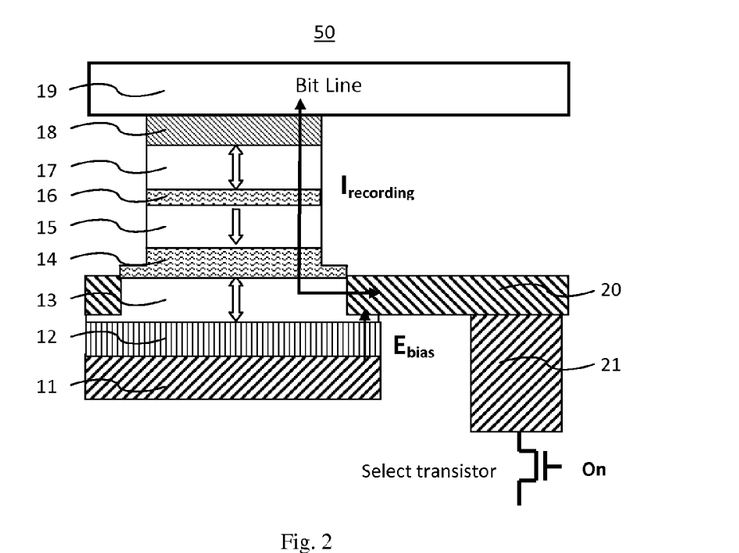
FIG. 2 illustrates a memory element, according to the first embodiment, having an upward electric field on a dielectric functional layer by a positive bias voltage pulse through the digital line and having a spin transfer recording current to reverse the first recording layer magnetization to the direction in accordance with a direction of a second current along the digital line.
Figure 3:
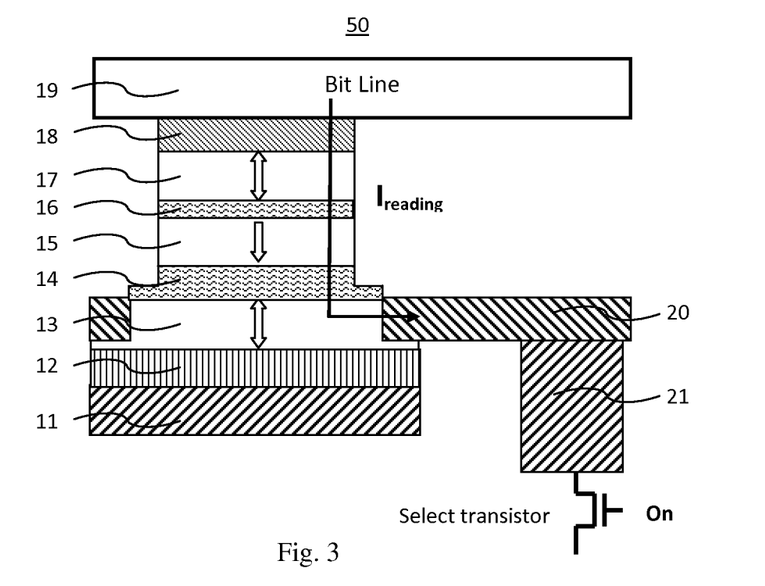
FIG. 3 illustrates a memory element, according to the first embodiment, having a reading current across a double MTJ stack for data reading.

FIGS. 2 and 3 show magnetoresistive element 30 illustrating the methods of recording and reading data in a spin-transfer-torque magnetoresistive memory, according the first embodiment, respectively. A circuitry, which is not shown here, is coupled to the bit line for providing a bi-directional recording current between the bit line and the middle electrode connecting to the select transistor, and is coupled to the digital line for providing an electric field on the dielectric functional between the digital line and the middle electrode. The magnetoresistive element 30 comprises: a digital line 11, a dielectric functional layer 12, a first recording layer 13, a first tunnel barrier 14, a reference layer 15, a second tunnel barrier 16, a second recording layer 17, a cap layer 18, a bit line 19, a middle electrode 20 and a drain contact via 21 of a select transistor.

FIG. 2 illustrates a memory element, according to the first embodiment. Both first and second recording layers are made of a single ferromagnetic layer having a perpendicular anisotropy and magnetization, or a multilayer with ferromagnetic sub-layers strongly coupled across thin nonmagnetic insertion sub-layer(s) having a perpendicular anisotropy and magnetization. During a recording operation, a positive bias voltage pulse through the digital line is tuned on to generate an electric field pointing upward on a dielectric functional layer. Then a spin transfer current having a first direction and a first voltage magnitude is tuned on to flow across the MTJ stack, the magnetization in the second recording layer is switched to the direction in accordance with a direction of a first spin transfer current across the MTJ stack. After the recording data in the second recording layer, the spin transfer current is changed to have a second voltage magnitude lower than the first magnitude along a second direction. As a combined result of positive bias voltage on the digital line and the second spin current, the perpendicular anisotropy in the first recording layer is decreased and its magnetization is readily switched to the direction in accordance with a second direction of a spin transfer current across the MTJ stack. As the bias voltage on the digital is tuned off, the magnetizations of the recording layers maintain along the recorded perpendicular directions. At last, the spin transfer current is tuned off to finish the recording process. The second voltage magnitude in the spin transfer current is sufficient low that the voltage drop on the second MTJ junction does not meet is its critical voltage to switch the second recording layer, so that the pre-written data in the second recording layer by the spin current having a first voltage magnitude is not affected by the spin current having a smaller second voltage magnitude.

FIG. 3 illustrates a memory element, according to the first embodiment, having a reading current flowing across the double MTJ stack. A total resistance is the sum of the first MTJ resistance and the second MTJ resistance. An example of two MTJ resistances is that the first resistance change from parallel state to anti-parallel state is R and the second resistance change from parallel state to anti-parallel state is 2R, while the total resistance when both MTJs are in parallel states is Ro. The four different states have resistance values: Ro, Ro+R, Ro+2R and Ro+3R.

The dielectric functional layer 12 serves to modify perpendicular magnetic anisotropy of the first recording layer 13. The functional layer 12 is preferred to be made of MgO layer, or other metal oxide (or nitride, chloride) layer which has a rocksalt crystalline as its naturally stable structure thereof will be described later.

The CoFeB (with B content no less than 15%) layer comprised in the first recording layer 13 is formed into an amorphous state as deposited. The MgO layer comprised in the functional layer is formed into rocksalt crystal grains with the (100) plane parallel to the substrate plane. In the rocksalt crystal structure, two fcc sublattices for Mg and O, each displaced with respect to the other by half lattice parameter along the [100] direction. Its lattice parameter along the {110} direction is ranged from 2.98 to 3.02 angstrom, which has slightly larger than bcc CoFe lattice parameter along {100} direction and has a lattice mismatch between 4% and 7%. After thermal annealing with a temperature higher than 250-degree, the amorphous CoFeB is crystallized to form bcc CoFe grains having epitaxial growth with (100) plane parallel to surface of the rocksalt crystal layers. Accordingly, a perpendicular magnetization is induced in the recording layer from the interaction at a lower interface with the MgO functional layer.

Since the MgO layer resistance increases exponentially with the thickness, a typical RA of an MTJ stack is preferred to be in the range of 3 to 20 ohm·μm$^2$, while the RA of an anisotropy modification layer can be made to be as high as 50K to 1 M ohm·μm$^2$, which makes the functional layer a good dielectric layer and the amount of leakage current from a digital line to the MTJ stack is negligible. Applying a positive voltage on the digital line generates an electric field pointing upwards from the top surface of the functional layer and decreases the perpendicular anisotropy strength in a recording layer. Accordingly, the magnetization of the recording layer is readily reversible.

After a successful data recording, a strong perpendicular anisotropy is restored in the first recording layer again, maintaining a good thermal stability and data retention of the memory cell. As a result, the margins among reading voltage, recording voltage and break-down voltage are improved.

During fabrication of the MRAM array architecture, each succeeding layer is deposited or otherwise formed in sequence and each magnetoresistive element may be defined by selective deposition, photolithography processing, etching, etc. using any of the techniques known in the semiconductor industry. Typically the layers of the MTJ stack are formed by thin-film deposition techniques such as physical vapor deposition, including magnetron sputtering and ion beam deposition, or thermal evaporation. In addition, the MTJ stack is typically annealed at elevated temperature to achieve a high magnetoresistive ratio and a desired crystal structure and interface.

Figure 4:
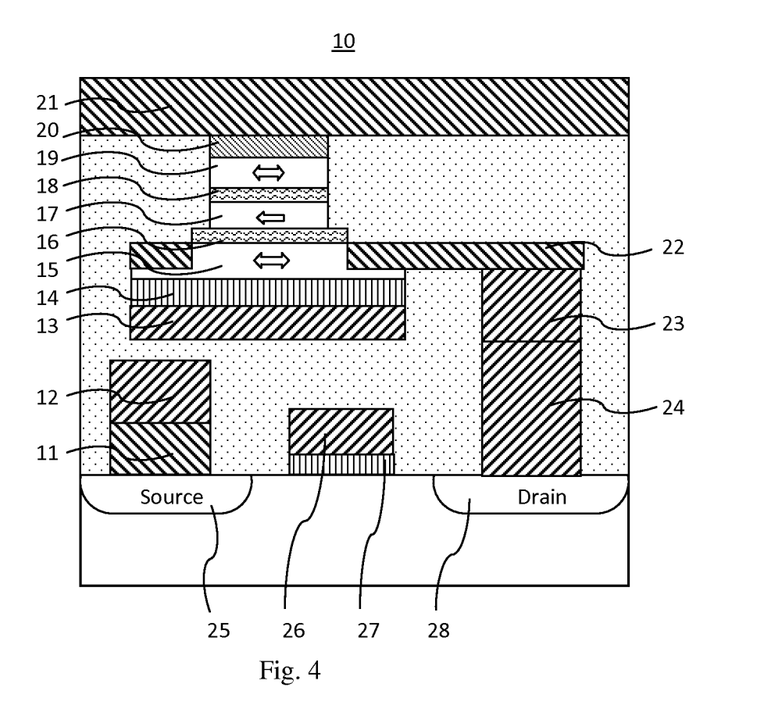
FIG. 4 is a cross-section of one memory cell in a planar STT-MRAM array, according to the second embodiment, having a double MTJ stack and an electric field assisted switching.

FIG. 4 is a cross-sectional view of a double MTJ magnetoresistive memory cell 10 in a STT-MRAM array having an electric field assisted switching. The magnetoresistive memory cell 10 is configured by a digital line 13, a dielectric functional layer 14, a first recording layer 15, a first tunnel barrier 16, a reference layer 17, a second tunnel barrier 18, a second recording layer 19, a cap layer 20, a bit line 21, and a select transistor comprising an interconnect layer 12, a source contact 11, a middle electrode 22, a via 23, drain contact 24, source region 25, a gate electrode 26, a gate insulating film 27 and a drain region 28.

Further, the reference layer can be a reference stack comprising a synthetic anti-ferromagnetic structure, or two synthetic anti-ferromagnetic multi-layered structure having an anti-ferromagnetic pinning layer in-between.

Figure 5:
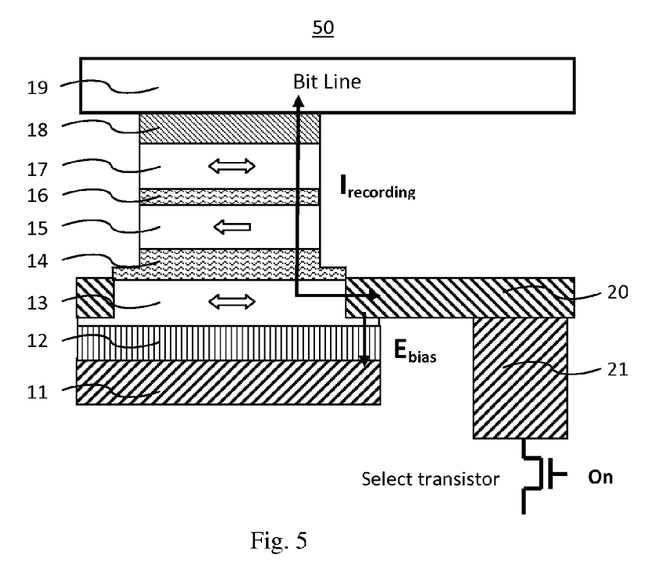
FIG. 5 illustrates a memory element, according to the second embodiment, having a downward electric field on a dielectric functional layer by a negative bias voltage pulse through the digital line to generate a magnetic bias field and having a spin transfer recording current to reverse the first recording layer magnetization to the direction in accordance with a direction of a second current along the digital line.
Figure 6:
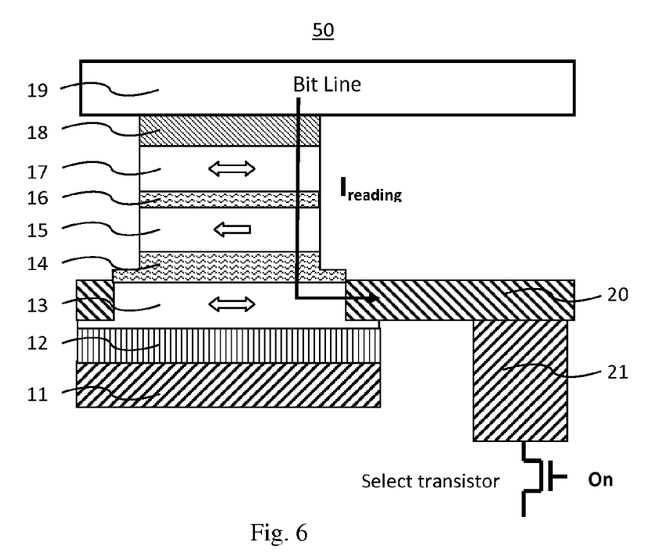
FIG. 6 illustrates a memory element, according to the second embodiment, having a reading current across a double MTJ stack for data reading.

FIGS. 5 and 6 show magnetoresistive element 30 illustrating the methods of recording and reading data in a spin-transfer-torque magnetoresistive memory, according the first embodiment, respectively. A circuitry, which is not shown here, is coupled to the bit line for providing a bi-directional recording current between the bit line and the middle electrode connecting to the select transistor, and is coupled to the digital line for providing an electric field on the dielectric functional between the digital line and the middle electrode. The magnetoresistive element 30 comprises: a digital line 11, a dielectric functional layer 12, a first recording layer 13, a first tunnel barrier 14, a reference layer 15, a second tunnel barrier 16, a second recording layer 17, a cap layer 18, a bit line 19, a middle electrode 20 and a drain contact via 21 of a select transistor.

FIG. 5 illustrates a memory element, according to the second embodiment. Both first and second recording layers are made of a single ferromagnetic layer having a perpendicular anisotropy and magnetization, or a multilayer with ferromagnetic sub-layers strongly coupled across thin nonmagnetic insertion sub-layer(s) having a perpendicular anisotropy and magnetization. During a recording operation, a negative bias voltage pulse through the digital line is tuned on to generate an electric field pointing downward on a dielectric functional layer. Then a spin transfer current having a first direction and a first voltage magnitude is tuned on to flow across the MTJ stack, the magnetization in the second recording layer is switched to the direction in accordance with a direction of a first spin transfer current across the MTJ stack. After the recording data in the second recording layer, the spin transfer current is changed to have a second voltage magnitude lower than the first magnitude along a second direction. As a combined result of negative bias voltage on the digital line and the second spin current, the perpendicular anisotropy in the first recording layer is increased and its magnetization is readily switched to the direction in accordance with a second direction of a spin transfer current across the MTJ stack. As the bias voltage on the digital is tuned off, the magnetizations of the recording layers maintain along the recorded directions which are along their anisotropy axis. At last, the spin transfer current is tuned off to finish the recording process. The second voltage magnitude in the spin transfer current is sufficient low that the voltage on the second MTJ junction does not meet is its critical voltage to switch the second recording layer, so that the pre-written data in the second recording layer by the spin current having a first voltage magnitude is not affected by the spin current having a smaller second voltage magnitude.

FIG. 6 illustrates a memory element, according to the second embodiment, having a reading current flowing across the double MTJ stack. A total resistance is the sum of the first MTJ resistance and the second MTJ resistance. An example of two MTJ resistances is that the first resistance change from parallel state to anti-parallel state is R and the second resistance change from parallel state to anti-parallel state is 2R, while the total resistance when both MTJs are in parallel states is Ro. The four different states have resistance values: Ro, Ro+R, Ro+2R and Ro+3R.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A spin-transfer torque magnetoresistive memory comprising a control circuitry and at least one memory cell comprising:
- a digital line provided on a surface of a substrate serving as a bottom electrode;
- a dielectric functional layer provided on the top surface of the digital line layer;
- a first recording layer provided on the top surface of the dielectric functional layer having magnetic anisotropy in a direction perpendicular to a film surface and having a variable magnetization direction;
- a first tunnel barrier layer provided on the top surface of the first recording layer;
- a reference layer provided on the top surface of the first tunnel barrier layer having magnetic anisotropy in a direction perpendicular to a film surface and having an invariable magnetization direction;
- a second tunnel barrier layer provided on the top surface of the reference layer;
- a second recording layer provided on the top surface of the second tunnel barrier layer having magnetic anisotropy in a direction perpendicular to a film surface and having a variable magnetization direction;
- a cap layer provided on the top surface of the second recording layer as an upper electric electrode;
- a middle electrode provided on sides of the first recording layer and electrically connected to the first recording layer;
- a bit line provided on the top surface of the cap layer;
- a CMOS transistor coupled the plurality of magnetoresistive memory elements through the middle electrode; and
- there is further provided circuitry connected to the bit line, the digital line and the select transistor of each magnetoresistive memory cell; and
- the control circuitry further configured to provide a first spin-transfer recording current having a first voltage magnitude along a first direction and a second spin transfer current having a second voltage magnitude along a second direction subsequently between the bit line and the select transistor and to provide a positive voltage on the digital line to generate an electric field on the dielectric functional layer and pointing upwards along the thickness direction to reduce the perpendicular anisotropy in the first recording layer in a recording operation; and
- the control circuitry further configured to provide a reading current between the bit line and the select transistor in a reading operation.

2. The element of claim 1, wherein said first spin transfer current having a first direction and a first voltage magnitude is tuned on to flow across the MTJ stack, the magnetization in said second recording layer is switched to the direction in accordance with a direction of a first spin transfer current across the MTJ stack during said recording operation.

3. The element of claim 1, wherein said the second spin transfer current having a second voltage magnitude lower than the first voltage magnitude along a second direction, the perpendicular anisotropy in said first recording layer is decreased and the magnetization of said first recording layer is readily switched to the direction in accordance with a second direction of a second spin transfer current across the MTJ stack during said recording operation.

4. The element of claim 1, wherein said the bias voltage on the digital is tuned off and said spin transfer current is tuned off to finish said recording operation.

5. The element of claim 1, wherein said second voltage magnitude in said second spin transfer current is selected in a range that the magnetization of said second recording layer is not switchable or reversible and the magnetization of said first recording layer is switchable or reversible as said bias voltage on digital is on.

6. The element of claim 1, wherein said first voltage magnitude in said first spin transfer current is selected in a range that the magnetization of said second recording layer is switchable or reversible and both tunnel barrier layers are not partially damaged or damaged.

7. The element of claim 1, wherein said first tunnel barrier layer and said second tunnel barrier layer are selected to form four different resistance states in said magnetoresistive element.

8. The element of claim 7, wherein said four resistance states preferred to be equal apart or close to equal apart.

9. The element of claim 1, wherein said functional layer is made of a metal oxide, or nitride, or oxynitride, or chloride layer having rocksalt crystal structure having the (100) plane parallel to the substrate plane and containing at least one element selected from Na, Li, Mg, Ca, Zn, Cd, In, Sn, Cu, Ag, preferred to be naturally stable rocksalt metal oxide or oxynitride selected from MgO, MgN, CaO, CaN, MgZnO, CdO, CdN, MgCdO, CdZnO.

10. The element of claim 1, wherein the thickness of said functional layer is preferred to be more than 1.5 nm and less than 10 nm.

11. The element of claim 1, wherein the perpendicular resistance of said functional layer is at least 500 ohms per square micron, preferred to be more than 5000 ohms per square micron.

12. The element of claim 1, wherein said digital line is made of a metal layer or multilayer having a thickness more than 2 nm and less than 2 microns, preferred to have at least one element selected from Ru, Cu, Au, Ag, Al, or other high conductive metal elements.

13. The element of claim 1, wherein said digital line is made of a metal multilayer having at least one interface layer at the top surface or the bottom surface, preferred to be selected from Ta, TaN, AlN, IrN, or other nano crystal or amorphous materials.

14. The element of claim 1, wherein said first recording layer is a ferromagnetic layer containing Boron, preferred to be CoFeB or CoB, the Boron composition percentage is preferred to be at least 10%.

15. The element of claim 1, wherein said first recording layer is a multi-layer comprising ferromagnetic sub-layers and optional nonmagnetic insertion sub-layers containing at least one element selected from Ta, Hf, Zr, Ti, Mg, Nb, W, Mo, Ru, Al, Cu, Si and having a thickness less than 0.5 nm.

16. The element of claim 1, wherein said first recording layer is a tri-layer comprising a first ferromagnetic sub-layer containing Boron and immediately adjacent to said functional layer, preferred to be CoB, or CoFeB, the B composition percentage is preferred to be at least 10%, a second ferromagnetic sub-layer having a perpendicular anisotropy, a nonmagnetic insertion layer provided between the first ferromagnetic sub-layer and the second ferromagnetic sub-layer having a thickness more than 0.3 nm and less than 3 nm.

17. The element of claim 1, wherein said first recording layer is a tri-layer comprising a first ferromagnetic sub-layer immediately adjacent to said functional layer, a second ferromagnetic sub-layer, a nonmagnetic insertion layer provided between the first ferromagnetic sub-layer and the second ferromagnetic sub-layer, and magnetic moments of the first ferromagnetic sub-layer is more than 70% of the magnetic moment of the second ferromagnetic sub-layer.

18. The element of claim 1, wherein said first recording layer has a first ferromagnetic sub-layer immediately adjacent to said functional layer having a reduced perpendicular anisotropy smaller than the demag field as an electric field applied on the functional layer and pointing upwards along the thickness direction.

19. A spin-transfer torque magnetoresistive memory comprising a control circuitry and at least one memory cell comprising:
  a digital line provided on a surface of a substrate serving as a bottom electrode;
  a dielectric functional layer provided on the top surface of the digital line layer;
  a first recording layer provided on the top surface of the dielectric functional layer having magnetic anisotropy in a film surface and having a variable magnetization direction;
  a first tunnel barrier layer provided on the top surface of the first recording layer;
  a reference layer provided on the top surface of the first tunnel barrier layer having magnetic anisotropy and having an invariable magnetization direction in a film surface;
  a second tunnel barrier layer provided on the top surface of the reference layer;
  a second recording layer provided on the top surface of the second tunnel barrier layer having magnetic anisotropy in a film surface and having a variable magnetization direction;
  a cap layer provided on the top surface of the second recording layer as an upper electric electrode;
  a middle electrode provided on sides of the first recording layer and electrically connected to the first recording layer;
  a bit line provided on the top surface of the cap layer;
  a CMOS transistor coupled the plurality of magnetoresistive memory elements through the middle electrode; and
  there is further provided circuitry connected to the bit line, the digital line and the select transistor of each magnetoresistive memory cell; and
  the control circuitry further configured to provide a first spin-transfer recording current having a first voltage magnitude along a first direction and a second spin transfer current having a second voltage magnitude along a second direction subsequently between the bit line and the select transistor and to provide a negative voltage on the digital line to generate an electric field on the dielectric functional layer and pointing downwards along the thickness direction to increase the perpendicular anisotropy in the first recording layer in a recording operation; and
  the control circuitry further configured to provide a reading current between the bit line and the select transistor in a reading operation.

20. The element of claim 1 and claim 19, wherein said first and second tunnel barrier layers are made of a metal oxide or a metal nitride, a metal oxynitride, preferred to be MgO, ZnO, MgZnO, MgN, MgON.

21. The element of claim 1, wherein said reference layer is a ferromagnetic layer having a perpendicular anisotropy at least 20% larger than the perpendicular anisotropies of the first recording layer and second recording layer.

22. The element of claim 1 and claim 19, further comprising an optional intermediate layer between the digital line and the functional layer having amorphous or nano-crystal structure, preferred to be a layer containing Boron and at least one element from Co, Fe, Ni and having a thickness between 0.3 nm and 3 nm.

23. The element of claim 19, wherein said first spin transfer current having a first direction and a first voltage magnitude is tuned on to flow across the MTJ stack, the magnetization in said second recording layer is switched to the direction in accordance with a direction of a first spin transfer current across the MTJ stack during said recording operation.

24. The element of claim 19, wherein said the second spin transfer current having a second voltage magnitude lower than the first voltage magnitude along a second direction, the perpendicular anisotropy in said first recording layer is increased and the magnetization of said first recording layer is readily switched to the direction in accordance with a second direction of a second spin transfer current across the MTJ stack during said recording operation.

25. The element of claim 19, wherein said the bias voltage on the digital is tuned off and said spin transfer current is tuned off to finish said recording operation.

26. The element of claim 19, wherein said second voltage magnitude in said second spin transfer current is selected in a range that the magnetization of said second recording layer is not switchable or reversible and the magnetization of said first recording layer is switchable or reversible as said bias voltage on digital is on.

27. The element of claim 19, wherein said first voltage magnitude in said first spin transfer current is selected in a range that the magnetization of said second recording layer is switchable or reversible and both tunnel barrier layers are not partially damaged or damaged.

28. The element of claim 19, wherein said first tunnel barrier layer and said second tunnel barrier layer are selected to form four different resistance states in said magnetoresistive element.

29. The element of claim 28, wherein said four resistance states preferred to be equal apart or close to equal apart.

30. The element of claim 19, wherein said functional layer is made of a metal oxide, or nitride, or oxynitride, or chloride layer having rocksalt crystal structure having the (100) plane parallel to the substrate plane and containing at least one element selected from Na, Li, Mg, Ca, Zn, Cd, In, Sn, Cu, Ag, preferred to be naturally stable rocksalt metal oxide or oxynitride selected from MgO, MgN, CaO, CaN, MgZnO, CdO, CdN, MgCdO, CdZnO.

31. The element of claim 19, wherein the thickness of said functional layer is preferred to be more than 1.5 nm and less than 10 nm.

32. The element of claim 19, wherein the perpendicular resistance of said functional layer is at least 500 ohms per square micron, preferred to be more than 5000 ohms per square micron.

33. The element of claim 19, wherein said digital line is made of a metal layer or multilayer having a thickness more than 2 nm and less than 2 microns, preferred to have at least one element selected from Ru, Cu, Au, Ag, Al, or other high conductive metal elements.

34. The element of claim 19, wherein said digital line is made of a metal multilayer having at least one interface layer at the top surface or the bottom surface, preferred to be selected from Ta, TaN, AlN, IrN, or other nano crystal or amorphous materials.

35. The element of claim 19, wherein said first recording layer is a ferromagnetic layer containing Boron, preferred to be CoFeB or CoB, the Boron composition percentage is preferred to be at least 10%.

36. The element of claim 19, wherein said first recording layer is a multi-layer comprising ferromagnetic sub-layers and optional nonmagnetic insertion sub-layers containing at least one element selected from Ta, Hf, Zr, Ti, Mg, Nb, W, Mo, Ru, Al, Cu, Si and having a thickness less than 0.5 nm.

37. The element of claim 19, wherein said first recording layer is a tri-layer comprising a first ferromagnetic sub-layer containing Boron and immediately adjacent to said functional layer, preferred to be CoB, or CoFeB, the B composition percentage is preferred to be at least 10%, a second ferromagnetic sub-layer having a perpendicular anisotropy, a nonmagnetic insertion layer provided between the first ferromagnetic sub-layer and the second ferromagnetic sub-layer having a thickness more than 0.3 nm and less than 3 nm.

38. The element of claim 19, wherein said first recording layer is a tri-layer comprising a first ferromagnetic sub-layer immediately adjacent to said functional layer, a second ferromagnetic sub-layer, a nonmagnetic insertion layer provided between the first ferromagnetic sub-layer and the second ferromagnetic sub-layer, and magnetic moments of the first ferromagnetic sub-layer is more than 70% of the magnetic moment of the second ferromagnetic sub-layer.

39. The element of claim 19, wherein said first recording layer has a first ferromagnetic sub-layer immediately adjacent to said functional layer having an enhanced perpendicular anisotropy as an electric field applied on the functional layer and pointing downwards along the thickness direction.

40. The element of claim 19, wherein said first and second recording layers are patterned into an in-plane shape having an aspect ratio between 1 and 5.

41. The element of claim 19, wherein said reference layer is a reference multilayered stack comprising a synthetic anti-ferromagnetic structure, or two synthetic anti-ferromagnetic multi-layered structure having an anti-ferromagnetic pinning layer in-between.

* * * * *